United States Patent [19]

Charles et al.

[11] Patent Number: 4,748,737

[45] Date of Patent: Jun. 7, 1988

[54] METHOD OF REMOVING SURFACE OXIDATION FROM PARTICULATES

[75] Inventors: Robert G. Charles, Allison Park; Graham A. Whitlow; Alan T. Male, both of Murrysville, all of Pa.

[73] Assignee: Westinghouse Electric Corp., Pittsburgh, Pa.

[21] Appl. No.: 802,562

[22] Filed: Nov. 27, 1985

[51] Int. Cl.⁴ .................................... H01L 39/12
[52] U.S. Cl. ........................ 29/599; 75/0.5 A; 75/0.5 AB; 75/0.5 B; 75/0.5 BB; 148/11.5 F; 148/11.5 P
[58] Field of Search ............... 148/11.5 F, 11.5 P, 148/20.3, 126.1; 75/0.5 A, 0.5 AB, 0.5 B, 0.5 BB; 29/599; 427/216, 217

[56] References Cited

U.S. PATENT DOCUMENTS

| | | | |
|---|---|---|---|
| 3,407,049 | 10/1968 | Freeman, Jr. et al. | 148/133 |
| 3,945,863 | 3/1976 | Precht | 148/126 |
| 3,969,157 | 7/1976 | Hutterer et al. | 148/14 |
| 4,050,147 | 9/1977 | Winter et al. | 29/599 |
| 4,240,831 | 12/1980 | Ro et al. | 75/228 |
| 4,411,959 | 10/1983 | Braginski et al. | 428/930 |
| 4,419,125 | 12/1983 | Charles et al. | 29/599 |
| 4,423,004 | 12/1983 | Ross | 419/35 |

Primary Examiner—R. Dean
Attorney, Agent, or Firm—A. Mich, Jr.

[57] ABSTRACT

A method of removing tenacious oxide film from particulates, such as submicron sized superconductor powder, to enhance the electrical characteristics of superconductor wire fabricated from the powder. The method includes removing the oxide film with an alkali metal, or a hydroxide of an alkali metal, and coating or plating the particles with a metal whose oxide is easily reduced just prior to use, such as by annealing the coated particulate in hydrogen.

19 Claims, 1 Drawing Sheet

"4,748,737"

METHOD OF REMOVING SURFACE OXIDATION FROM PARTICULATES

BACKGROUND OF THE INVENTION

1. Field of the Invention:

The invention relates in general to particulates, and in a preferred embodiment to superconductor powder and methods of improving its electrical characteristics.

2. Description of the Prior Art:

U.S. Pat. No. 4,411,959, which is assigned to the same assignee as the present application, discloses superconductor wire fabrication techniques which utilize a submicron-particle size powder selected from any superconducting material that can be synthesized in the form of ultrafine micro-powder. The superconductor powder, which may be produced by hydrogen plasma reaction, as set forth in U.S. Pat. No. 4,050,147, or by co-reducing a mixture of metal halides with liquid alkali metal, as disclosed in U.S. Pat. No. 4,419,125, should have a particle size of less than 1,000 angstroms, with significant contribution from 100 angstrom sizes.

For optimized superconducting properties, there should be direct physical contact between the surfaces of the adjacent particles during wire fabrication, with no intervening layers of surface oxide between the particles. A superconductor compound which includes niobium is a preferred material in the superconductor wire of the hereinbefore mentioned U.S. Pat. No. 4,411,959, such as niobium carbide (NbC), niobium aluminide (Nb$_3$Al), niobium carbonitride (NbCN) niobium stannide (Nb$_3$Sn) and ternary variations such as Nb$_3$(Al,Ge). It has been found that particulates of such niobium compounds, especially NbC and NbCN when prepared by plasma techniques, are covered by a tenacious film of niobium oxide (Nb$_2$O$_5$) about 10 angstroms thick. It would thus be desirable to not only remove the niobium oxide prior to wire fabrication, but to preserve a pristine surface on the superfine superconductor particles right up to the point of powder encapsulation in a tube which starts the wire fabrication process.

SUMMARY OF THE INVENTION

Briefly, the present invention includes new and improved methods of removing tenacious surface oxides from submicron size semiconductor particulates, and for insuring that the particulates are free of oxide at the point of use. While the new and improved methods were developed specifically to enhance the electrical characteristics of superconductor wire constructed of submicron-particle superconductor powder, the methods will also be useful for removing tenacious oxide films from other particulates, and for insuring that a tenacious film will not reform prior to the use of the particulate.

More specifically, the new and improved methods include removal of the tenacious oxide film from the powder particles by use of an alkali metal hydroxide, or by an alkali metal. If the former, the clean particulate surfaces are temporarily protected against reoxidation by hydrazine dissolved in water. If the latter, the molten alkali metal temporarily protects the clean surfaces. Permanent protection against the formation of the tenacious oxide is provided by coating or plating each particle with a metal whose oxide is easily removed or chemically decomposed. This is accomplished by electroless deposition of the desired metal in aqueous solution, or by reduction of a salt of the desired metal in molten alkali metal. Any superficial oxide which may coat the selected protection metal is removed by chemical reduction immediately prior to use of the powder by annealing the particulate in a hydrogen atmosphere. An inert gas may then be used to protect the particulates between the annealing oven and point of use.

BRIEF DESCRIPTION OF THE DRAWINGS

The invention may be better understood and further advantages and uses thereof more readily apparent, when considered in view of the following detailed description of exemplary embodiments, taken with the accompanying drawings in which.

DESCRIPTION OF THE PREFERRED EMBODIMENT

In order to reduce the length and complexity of the present application, U.S. Pat. No. 4,411,959, which describes the fabrication of submicron-particle ductile superconductor wire, is incorporated into the present application by reference. While the new and improved methods to be hereinafter described will refer to niobium compound superconductor powders or particulates, it is by way of example only. It is felt the disclosed methods will advantageously apply to the removal of tenacious oxides from other particulates, and to the protection of such other particulates against the reformation of another tenacious oxide.

Figure 1:
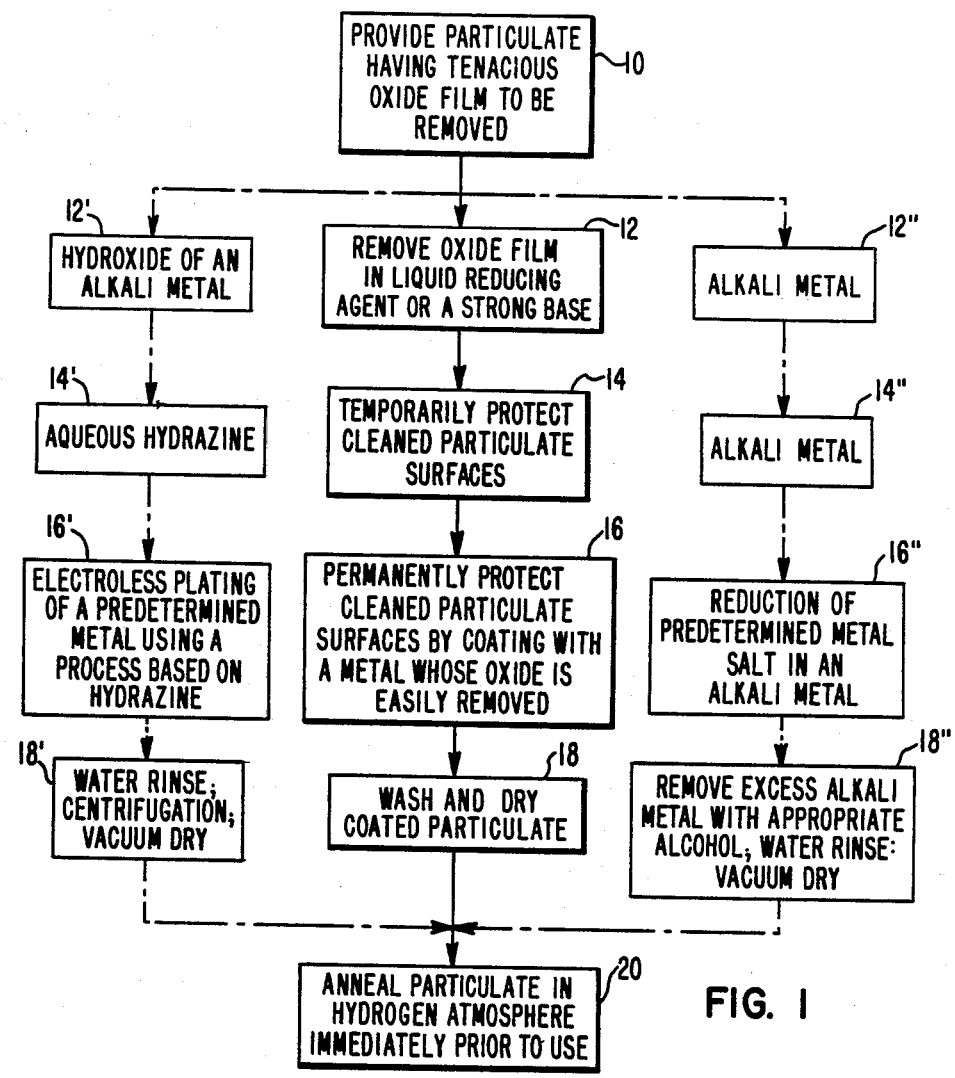
FIG. 1 is a block diagram outlining new and improved methods of removing tenacious oxide films from the surfaces of the particles which make up the particulate.

Referring now to FIG. 1, step 10 of the new and improved methods provides a particulate having a tenacious oxide film to be removed. For purposes of example, the particulate will be assumed to be a submicron-particle superconductor powder, and more specifically, a niobium-based binary or ternary compound having a tenacious film of niobium oxide (Nb$_2$O$_5$) on the surfaces of the microparticles. Such compounds includes niobium carbide (NbC), niobium aluminide (Nb$_3$Al), niobium carbonitride (NbCN), niobium stannide (Nb$_3$Sn), and ternary compounds such as but not limited to Nb$_3$(Al,Ge).

Broadly, the next step 12 of the method is to chemically remove the tenacious oxide film, either by a liquid-reducing agent, or by a strong base. As shown in FIG. 1, step 12 may be performed as shown in block 12' by soaking the particulate in a water solution of a hydroxide of an alkali metal, such as sodium hydroxide (NaOH) or potassium hydroxide (KOH). While the water solution is preferred, the oxide may also be removed by fusing with neat (non-aqueous) alkali hydroxide. One of several possible reactions responsible for the dissolution of Nb$_2$O$_5$ in a water solution of NaOH is given by (1) below.

$$Nb_2O_5 + 6 NaOH \rightarrow 2Na_3NbO_4 + 3H_2O \qquad (1)$$

FIG. 1 also sets forth an alternative for implementing step 12, which is shown in block 12" which involves heating the particulate with a liquid, strongly-reducing fusible metal, e.g., the alkali metals such as sodium, lithium, potassium, or mixtures thereof. Other suitable reducing metal mixtures include magnesium or calcium dissolved in a molten alkali metal. The simplest reaction between the $Nb_2O_5$ surface layer on the particle surfaces and an alkali metal M is reduction to niobium metal, as set forth by the following reaction:

$$Nb_2O_5 + 10M \rightarrow Nb + 5M_2O \quad (2)$$

Intermediate, or in some cases final, steps may include reduction of the $Nb_2O_5$ to an intermediate form of niobium oxide having lower valence state. This may occur, for example, by the following reaction, in which X is less than 5:

$$Nb_2O_5 + 2xM \rightarrow Nb_2O_{5-x} + xM_2O \quad (3)$$

Regardless of whether the reaction proceeds according to reaction (2) or reaction (3), the intent is to disrupt the $Nb_2O_5$ particulate coating sufficiently to allow plating of the underlying particle by a second metal, as will be hereinafter described. Disruptive forces are expected since the reaction products Nb or $Nb_xO_y$ should differ significantly in crystal structure and physical density from the tenacious $Nb_2O_5$ film.

Broadly, the next step of the method is to temporarily protect the cleaned particulate surfaces. If the oxide film has been removed by a hydroxide of an alkali metal in step 12', this temporary protection is provided as disclosed in step 14' of FIG. 1 by a suspension of the particulate in an alkaline aqueous solution of hydrazine $(H_4N_2)$. Hydrazine acts as a reducing agent for adventitious atmospheric oxygen, which would otherwise reform surface $Nb_2O_5$. The hydrazine reaction is as follows:

$$H_4N_2 + O_2 \rightarrow 2H_2O + N_2 \quad (4)$$

While many other reducing agents, e.g., sulfite ions, react with gaseous oxygen, hydrazine is superior for the present method because excess reducing agent, as well as the reaction products of reaction (4), are readily removed by simple evaporation.

If the oxide film has been removed by a liquid alkali metal in step 12", the temporary protection step is inherently provided by maintaining the particulate in the alkali metal, as indicated in block 14".

Broadly, the next step 16 of the method is to permanently protect the cleaned particulate surfaces by coating these surfaces with a metal whose oxide is superficial and easily removed or chemically reduced, such as by annealing in hydrogen. If the temporary oxide protection was implemented by aqueous hydrazine, as set forth in step 14', step 16 is implemented as set forth in 16', by an electroless plating of a predetermined metal, preferably using a process based on hydrazine since hydrazine is already present in the role of anti-oxidant. In other words, while the particulate is still wet with hydrazine-water, the particulate mass is subjected to electroless plating of a metal selected for ease in removal of its oxide, such as copper. Other suitable metals include silver, lead, tin, gold, the platinum group metals, and the alloys of these metals. Nickel and cobalt are undesirable for use with superconducting particulates because of the ferromagnetism characteristics of these metals. Nickel and cobalt, as well as alloys involving these metals, would, however, be suitable for applications involving particles which are not superconducting. Because of the large total surface area of the particulate mass, metal deposition occurs preferentially on the particles rather than on the container. Optimum plating conditions have been achieved by vigorous agitation during the plating step to insure uniform plating of all particles. A combination of mechanical stirring and ultrasonic agitation has been found to be excellent.

If the temporary protection against oxide reformation was implemented by retaining the particles in the alkali metal, as indicated by step 14", the plating step is performed as set forth in step 16". In this step, the appropriate metal salt is heated with a liquid alkali metal, such as liquid sodium. Metal chlorides, such as $CuCl_2$, $Cu_2Cl_2$, $SnCl_2$, $PbCl_2$, and the like, are convenient sources of the plating metal. Other compounds which might be employed are the corresponding fluorides, bromides, iodides, sulfates, and, in some cases, the oxides. A representative plating reaction is:

$$CuCl_2 + 2Na \rightarrow Cu + 2NaCl \quad (5)$$

In a preferred procedure, the deoxidizing and plating steps 12", 14" and 16" are combined. For example, a weighed mixture of particulate nobium carbide and powdered cupric chloride is intimately mixed and added to an excess of sodium metal in a suitable reaction vessel under an inert atmosphere. The mixture is heated at 600° C. for 1½ hours, preferably with ultrasonic agitation, and then cooled.

An alternative to the combined reduction described above is to first heat a mixture of the particulate with an excess of alkali metal until the deoxidizing step is complete. By the use of a suitably designed reaction vessel, powdered metal salt can then be added in a separate step, to the still-molten reaction mixture to effect the plating step.

Broadly, the next step of the method is to wash and dry the coated particulate, as set forth in step 18. If the plating was accomplished in step 16', step 18 is implemented, as set forth in step 18', by washing the coated particles with successive portions of water, followed by centrifugation. Filtering is not practical with the submicron size particles in the example.

As the superconductor particles become free of ionic impurities, centrifugation may become difficult because of the fact that the surface area of the particles is much greater than the volume, and because the surface electrical charge is removed from the particles, causing the formation of colloidal suspensions. This problem may be greatly alleviated by the addition of a small amount of ammonium chloride ($NH_4Cl$) to the final washings. Any ammonium chloride remaining in the product volatizes during an annealing step which will be subsequently described, by the following reaction:

$$NH_4Cl \rightarrow NH_3 + HCl \quad (6)$$

The washed product is then dried, preferably in a partial vacuum with suitable precautions against reoxidation by atmospheric oxygen. For example, the dried particulate may be stored in a sealed container.

If the plating was accomplished in step 16", step 18 may be implemented as set forth in step 18". Excess alkali metal is removed by an appropriate alcohol. For example, the reaction when sodium is the metal used in step 16", is as follows, where R may be $C_2H_5$, or the like:

$$2Na + 2ROH \rightarrow 2NaOR + H_2 \quad (7)$$

The by-product NaCl shown in reaction (5) is dissolved by successive treatment with portions of water, or with water-hydrazine mixtures. The dried product may be protected from the atmosphere by storing in a sealed container under vacuum or an inert gas such as argon or nitrogen.

The metals most suitable for coating the particulate can themselves form surface oxide coatings which may degrade the electrical properties of a superconductor wire fabricated from the particulate. These oxides, however, have the advantage in that they are readily reducible to the parent metal. Thus, the last step of the method, shown in step 20, is to simply anneal the particulate in hydrogen. For example, if the plating material is copper, the particulate may be annealed in hyrdrogen at a temperature of 450° C. The reaction is as follows:

$$CuO + H_2 \rightarrow Cu + H_2O \qquad (8)$$

The tenacious coating $Nb_2O_5$ cannot be removed by hydrogen annealing. After hydrogen annealing, the treated particles are protected by an inert atmosphere while being transported between the annealing oven and the point of use. This step is set forth in FIG. 2, which continues the method for the specific superconductor wire in the example utilized to explain the methods.

Figure 2:
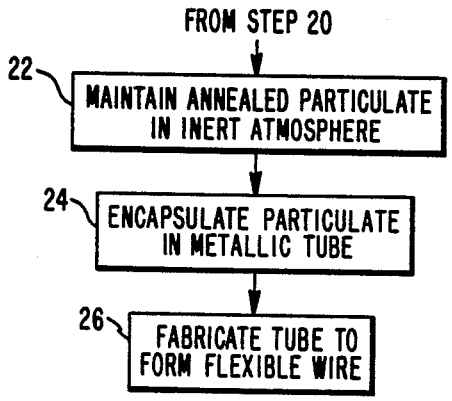
FIG. 2 is a block diagram which extends the methods of FIG. 1 to the fabrication of superconductor wire.

The step of maintaining the annealed particulate in an inert atmosphere while being transported to an encapsulating tube is set forth in step 22 of FIG. 2. Step 24 encapsulates the particulate in a metallic tube, and step 26 fabricates the tube to form a flexible superconductor wire, as described in detail in the incorporated U.S. Pat. No. 4,411,959.

In summary, the disclosed methods may be advantageously applied to superconductor particles prior to fabrication of the particulate into superconductor wire, to optimize current transfer by increased contact area between oxide free metallic coatings on the particles. The disclosed methods may also be used for particulates other than superconductors, in any application where finely divided particulates have a tenacious oxide film which is deleterious to the intended application.

We claim as our invention:

1. A method of removing an oxide film from a particulate, comprising the steps of:
   (A) providing a particulate having a tenacious oxide film,
   (B) cleaning surface oxide from particles of the particulate and temporarily protecting the cleaned particulate surfaces against oxidation using
      (1) an aqueous alkali metal hydroxide followed by aqueous hydrazine, or
      (2) a molten alkali metal selected from the group consisting of sodium, lithium, potassium, and mixtures thereof,
   (C) and coating the cleaned particulate surfaces with a metal whose oxide is superficial and removable by heating the particulate in a predetermined atmosphere.

2. The method of claim 1 wherein the step of providing a particulate provides submicron superconductor particles.

3. The method of claim 1 wherein the step of providing a particulate provides submicron superconductor particles including a compound of niobium, with the tenacious oxide film to be removed being niobium oxide ($Nb_2O_5$).

4. The method of claim 1 wherein the step of coating the cleaned particulate surface uses a metal selected from the group consisting of copper, silver, gold, lead, tin, and the platinum group metals.

5. The method of claim 1 including the step of annealing the coated particulate in a hydrogen atmosphere.

6. The method of claim 5 including the step of maintaining the particulate in an inert atmosphere following the annealing step, until the particulate is utilized in fabricating a wire.

7. The method of claim 1 wherein the step of providing a particulate provides submicron superconductor particles, and including the steps of:
   annealing the coated particulate in a hydrogen atmosphere,
   transferring the annealed particulate to an encapsulating tube in an inert atmosphere,
   encapsulating the annealed particulate in the tube,
   and fabricating the tube to provide a flexible superconductor wire having enhanced electrical characteristics.

8. A method of removing a film of $Nb_2O_5$ from a niobium-containing particulate and of thereafter protecting said particulate from the further formation of said film of $Nb_2O_5$ comprising:
   (A) contacting said particulate with an aqueous solution of an alkali metal hydroxide;
   (B) contacting said particulate with an aqueous solution of hydrazine; and
   (C) electrolessly plating said particulate with a metal that forms an easily removable oxide on said particulate.

9. A method according to claim 8 wherein said particulate is selected from the group consisting of niobium carbide, niobium aluminide, niobium carbonitride, niobium stannide, and $Nb_3(Al,Ge)$.

10. A method according to claim 8 wherein said alkali metal hydroxide is selected from the group consisting of NaOH and KOH.

11. A method according to claim 8 wherein said metal is selected from the group consisting copper, silver, gold, lead, tin, and the platinum group metals.

12. A method according to claim 8 wherein said niobium-containing particulate is made of a superconducting material, including the additional last steps of rinsing and drying said particulate, annealing said particulate in a hydrogen atmosphere, transferring said particulate to an encapsulating tube in an inert atmosphere, encapsulating said particulate in said tube, and drawing said tube into a superconducting wire.

13. A method of removing a film of $Nb_2O_5$ from a niobium-containing particulate and for thereafter protecting said particulate from the further formation of said film of $Nb_2O_5$ comprising forming a mixture of said particulate, molten alkali metal, and a salt of a plateable metal, whereby said plateable metal plates onto said particulate.

14. A method according to claim 13 wherein said mixture is heated under an inert atmosphere.

15. A method according to claim 13 wherein said particulate is selected from the group consisting of niobium carbide, niobium aluminide, niobium carbonitride, niobium stannide, and $Nb_3(Al,Ge)$.

16. A method according to claim 13 wherein said molten alkali metal is sodium.

17. A method according to claim 13 wherein said salt is selected from the group consisting of $CuCl_2$, $Cu_2Cl_2$, $SnCl_2$, and $PbCl_2$.

18. A method according to claim 13 wherein said mixture is heated at 600° C. for 1½ hours.

19. A method according to claim 13 wherein said niobium-containing particulate is made of a superconducting material, including the additional last steps of rinsing and drying said particulate, annealing said particulate in a hydrogen atmosphere, transferring said particulate to an encapsulating tube in an inert atmosphere, encapsulating said particulate in said tube, and drawing said tube into a superconducting wire.

* * * * *